United States Patent [19]

Murari et al.

[11] Patent Number: 5,530,345

[45] Date of Patent: Jun. 25, 1996

[54] AN INTEGRATED HALL•EFFECT APPARATUS FOR DETECTING THE POSITION OF A MAGNETIC ELEMENT

[75] Inventors: Bruno Murari, Monza; Sandro Storti, Sesto San Giovanni; Flavio Villa, Milan, all of Italy

[73] Assignee: SGS-Thomson Microelectronics S.r.L., Agrate Brianza, Italy

[21] Appl. No.: 129,842

[22] Filed: Sep. 30, 1993

[30] Foreign Application Priority Data

Sep. 30, 1992 [EP] European Pat. Off. .............. 92830544

[51] Int. Cl.⁶ .......................... G01R 33/06; H01L 27/22; H01L 43/06
[52] U.S. Cl. ................. 324/207.2; 324/252; 324/207.24; 338/32 H; 257/427; 257/426
[58] Field of Search ........................... 324/207.2, 207.11, 324/207.21, 207.24, 251, 252; 338/32 H, 32 R, 324–326; 307/309; 257/423, 427, 425

[56] References Cited

U.S. PATENT DOCUMENTS

| | | | |
|---|---|---|---|
| 3,041,416 | 6/1962 | Kuhot | 338/32 H |
| 3,139,600 | 6/1964 | Rasmanis et al. | 324/207.2 X |
| 4,607,271 | 8/1986 | Popovic et al. | 324/252 X |
| 4,658,214 | 4/1987 | Petersen | 324/207.24 |
| 4,728,950 | 3/1988 | Hendrickson et al. | 340/870.31 |
| 4,731,579 | 3/1988 | Petersen et al. | 324/207.24 |
| 4,829,352 | 5/1989 | Popovic et al. | 324/252 X |

FOREIGN PATENT DOCUMENTS

| | | | |
|---|---|---|---|
| 0427882 | 5/1991 | European Pat. Off. . | |
| 0021384 | 2/1983 | Japan | 338/32 H |
| 0011679 | 1/1991 | Japan | 324/207.2 |
| 0011678 | 1/1991 | Japan | 324/207.2 |
| 4026170 | 1/1992 | Japan | 338/32 H |

OTHER PUBLICATIONS

"Hall Effect Transducer's" Microswitch, Honeywell Division, 1982, pp. 1–3, 158–159.
"Device Comprising a Hall Element Incorporated in an Integrated Circuit", WO 86/07195, International Patent Application, Dec. 4, 1986.
Patent Abstracts of Japan, vol. 12, No. 377, (P–768), Oct. 1988 & JP-A–63122911 (Kobe Steel Ltd), May 26, 1988.

Primary Examiner—Sandra L. O'Shea
Assistant Examiner—Jay M. Patidar
Attorney, Agent, or Firm—David M. Driscoll; James H. Morris

[57] ABSTRACT

For detecting the position of a magnetic element having a field component zeroing in at least one point in space, typically in a plane, a plurality of elementary Hall-effect sensors are integrated side by side and aligned in a direction perpendicular to the zeroing field component and to the current flowing through the elementary sensors. The elementary sensor generating a zero output voltage therefore indicates the zero position of the field component and consequently the position of the magnetic element with respect to the position sensor, so that The outputs of the elementary sensors provide a quantized numeric code indicating the position of the magnetic element.

21 Claims, 3 Drawing Sheets

AN INTEGRATED HALL-EFFECT APPARATUS FOR DETECTING THE POSITION OF A MAGNETIC ELEMENT

BACKGROUND OF THE INVENTION

1. Field of the Invention

This invention relates to a position sensor for detecting a magnetic element.

2. Discussion of the Related Art

For detecting the position of an object, some transducers exploit the Hall effect, whereby, if a conductor material through which current flows in one direction is immersed in a magnetic field directed perpendicular to the current flow direction, across the sensor an electric field is observed perpendicular to both the current and the magnetic field and proportional to the strength of the magnetic field at that point.

Consequently, with known Hall-effect transducers, by measuring the potential difference across the sensor, it is possible to determine the position of a magnetic element (e.g., a permanent magnet or magnetic circuit) whose field pattern is known.

Generally, as the magnetic field of the magnetic element varies in space, typical sensors only provide for accurate determination of position when the magnetic element is moved solely in a given straight line, typically parallel or perpendicular to the sensor. Any unpredictable component in the movement of the magnetic element introduces measuring errors, thus impairing the reliability and limiting the scope of known Hall-effect transducers.

Further limitations are posed by the sensitivity of Hall-effect transducers to any misalignment of the magnetic element and sensor, and to variations in the quantities affecting the transfer constant, such as supply voltage and current, and the characteristics of the sensor (e.g. in the case of solid-state sensors, carrier mobility being dependent on temperature). As a result, known transducers involve mechanical alignment, electrical calibration, and highly complex circuitry for compensating for variations in operating conditions such as temperature. Even these provisions do not always succeed in achieving the desired accuracy and reliability in the transducer.

To solve these problems, an array of Hall type elementary sensors has been employed to determine the zero point of the field component and to generate directly at the output a numeric code indicating the zero point position (see, e.g. EP-A-0 427 882).

Moreover, it is known to integrate a single Hall effect cell in an integrated circuit (see e.g. G. Bosch, "A Hall device in an integrated circuit", Solid State Electron, vol. 11, pages 712 to 714, 1968; G. S. Randhawa "Monolithic integrated Hall devices in silicon circuits", Microelectron. Journal, vol 12, pages 24 to 29, 1981).

Accordingly, commercial products, having the structure shown in FIG. 5, have been developed. These products include a substrate 50 (preferably of P-type), an epitaxial N-type layer 51 having depth t, a P$^+$-type isolation region 52 formed in the epitaxial layer 51 for delimiting an active region 53, and N$^+$-type contacts 54, 55 formed during the emitter diffusion step of the integrated circuit. The Hall voltage $V_H$ of such cell is:

$$V_H = G \frac{BI}{qNt} \quad (1)$$

wherein G is a geometrical correction factor due to the finite dimensions of the cell (G=1, by conveniently dimensioning the cell), N is the concentration of doping species of the epitaxial layer, t is the depth of the epitaxial layer, and B is the component of the magnetic induction which is perpendicular to the current I.

SUMMARY OF THE INVENTION

It is an object of the present invention to provide a position sensor which has a high degree of reliability and is simple and cheap to manufacture, using well known manufacturing steps.

According to the present invention, a position detector for a magnetic element which generates a magnetic field having a component which zeros at a point in space includes a first plurality of adjacent hall-effect sensors and a zero detector. The zero detector generates an output signal indicating a position of the sensor which indicates where the component of the magnetic field is zero.

In one embodiment, the zero detector includes a number of comparators, each of which is connected to a sensor and provides an output signal indicating the sign of the magnetic field component at a location. An encoder is connected to the outputs of the comparators and generates a position signal indicating the position of the magnetic element relative to the one of the sensors. In another embodiment, the zero detector has a multiplexer which has a number of input terminals connected to the sensors, a comparator for receiving an input signal from the multiplexer, and a counter connected to the output of the comparator. A second plurality of adjacent sensors may be provided near and parallel to the first plurality of adjacent sensors.

The sensor is preferably integrated in a semiconductor body which has a substrate of a first conductivity type, a bottom isolated region of the first conductivity type and an epitaxial layer of a second opposed conductivity type which overlies the bottom isolation region. The epitaxial layer defines an upper large space of the semiconductor body. A top isolation region of the second conductivity type is grown in the epitaxial layer and laterally delimits an active region in the epitaxial layer. An interface isolation region of the first conductivity type is grown into the epitaxial layer and isolates the active region in the epitaxial layer from the upper face. Contact regions of The second conductivity type are provided in direct conduct with the active region of the epitaxial layer.

BRIEF DESCRIPTION OF THE DRAWINGS

Preferred non-limiting embodiments of the present invention will be described by way of example with reference to the accompanying drawings, in which.

DETAILED DESCRIPTION

Figure 1:
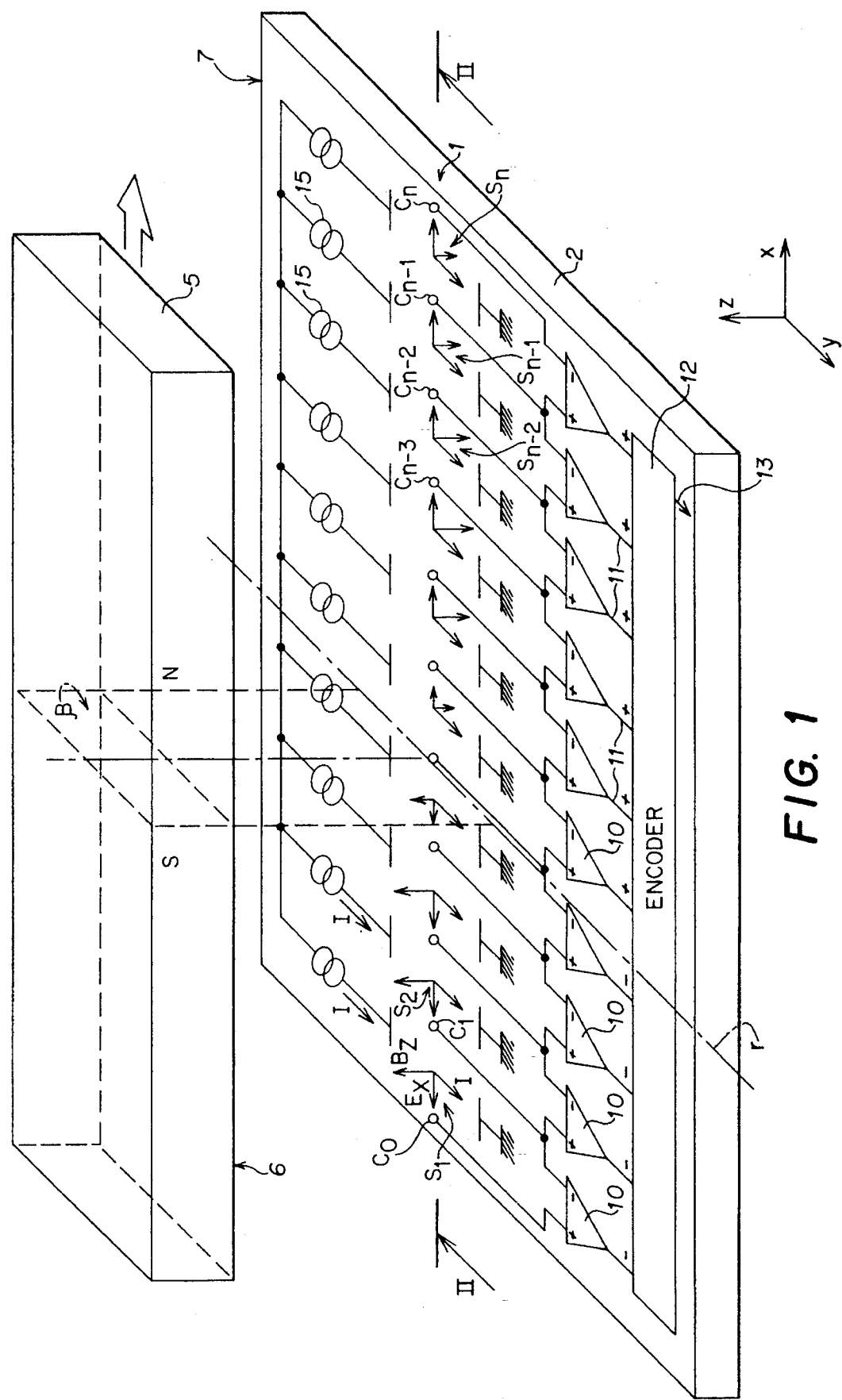
FIG. 1 is a perspective view of a transducer-encoder including the sensor according to the present invention.
Figure 2:
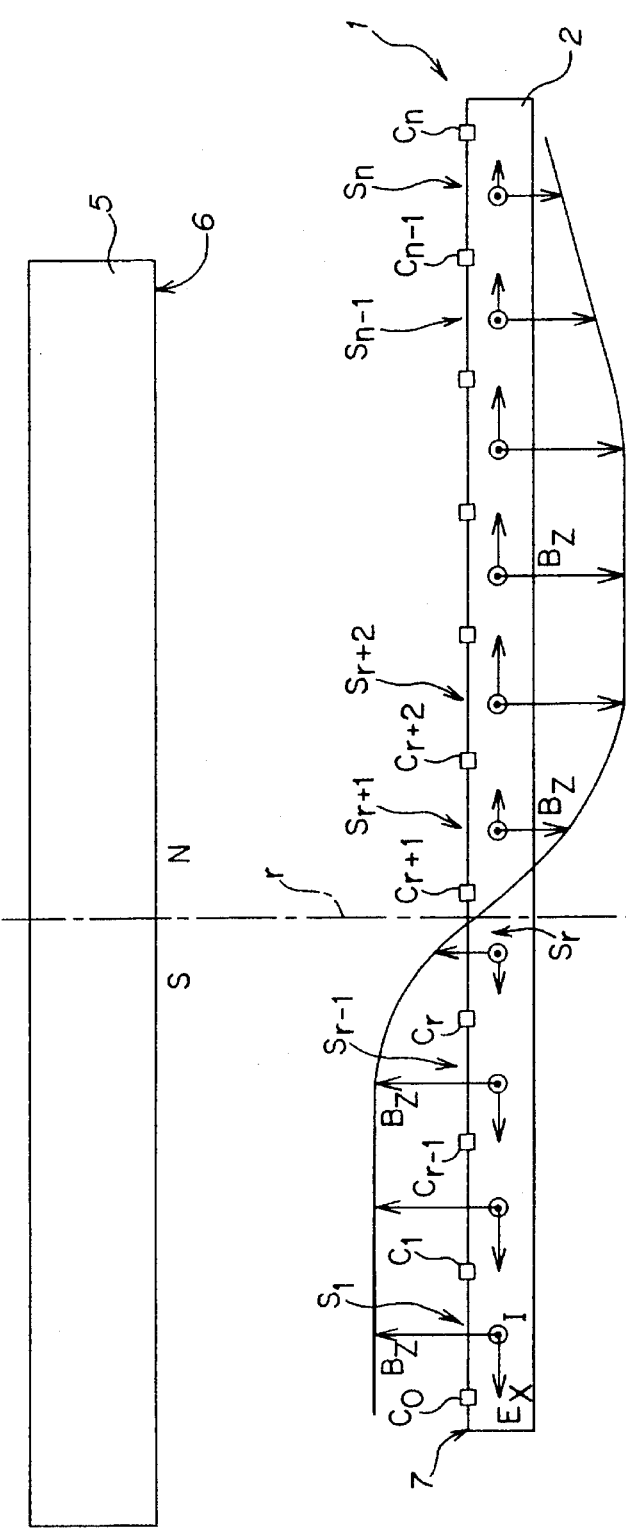
FIG. 2 is a schematic cross section of the sensor of FIG. 1 taken along line II—II.

Referring to FIGS. 1 and 2, solid-state type sensor 1 is formed in a chip 2 of semiconductor material (typically silicon). Sensor 1 comprises a plurality of elementary sensors $S_1, S_2, \ldots S_i, S_{i+1}, \ldots S_n$, aligned side by side in one direction (hereinafter referred to as the X axis). Each sensor is supplied with a current I directed perpendicular to the X axis, in the direction indicated by the Y axis. Each elementary sensor $S_i$ has a pair of contacts $C_{i-1}$, $C_i$, which are aligned along the X axis and are shared respectively with the previous sensor $S_{i-1}$ and the following sensor $S_{i+1}$.

Sensor 1 is located in a magnetic field generated by a permanent magnet 5 in the form of an elongated bar, the north and south poles N and S of which are formed on face 6 which faces surface 7 of sensor 1 (which defines the XY plane and on which elementary sensors $S_i$ are arranged). Permanent magnet 5 and the line joining the N and S poles are arranged parallel to the X axis, so that permanent magnet 5 generates a magnetic field having magnetic induction B whose component perpendicular to the current flow direction and that in which the sensor contacts are aligned (Z axis direction) is zero in one plane. In other words, for permanent magnet 5, there exists a plane β (FIG. 2) in which magnetic induction component $B_Z$ is zeroed; this plane, parallel to plane YZ, may be described by the equation X=K, where K is constant, and intercepts surface 7 along line r parallel to the Y axis. Though magnetic induction B in plane β is not zero—indeed component $B_X$ is maximum—sensors $S_i$ are only sensitive to magnetic induction component $B_Z$.

Due to the nature of the Hall effect:

$$E = qV \times B$$

wherein E is the electric field (boldface type indicates vector quantities), q is the electrical charge of the moving particles, V is the speed of the moving particles; and B is the magnetic induction. Thus electric field E is proportional to vectorial product I×B (I=qV).

In the present case, since contacts $C_i$ are aligned along the X axis, sensors $S_i$ are only sensitive to electric field component $E_X$; and since current I is directed parallel to the Y axis, component $E_X$ is proportional to the product of current I and magnetic induction component $B_Z$, i.e., $$E_X = (K_1)(I)(B_Z)$$

In the example shown, because magnetic induction component $B_Z$ (and therefore $E_X$) is zeroed along line r, if $S_r$ is the sensor through which line r extends, then for all the sensors $S_1 \ldots S_{r-1}$ to the left of sensor $S_r$, $B_Z > 0$ and $E_X > 0$; and, for all the sensors $S_{r+1} \ldots S_n$ to the right of sensor $S_r$, $B_Z < 0$ and $E_X < 0$.

Consequently, by measuring the difference in potential $DV_i$ between contacts $C_{i-1}$, $C_i$ of each sensor $S_i$:

$$DV_i = V_i - V_{i-1} < 0 \text{ when } i < r$$

and $$DV_i = V_i - V_{i-1} > 0 \text{ when } i > r$$

When magnet 5 moves parallel to the X axis, plane β and consequently line r also move rigidly together with magnet 5, thus changing the sensor $S_i$ in which the sign of component $B_Z$ and consequently the detected potential difference $DV_i$, are inverted. The sensor therefore defines, in each case, the position of plane β and, given the crossover line between the north and south poles N and S of magnet 5, the position of magnet 5 in relation to sensor 1. By detecting the point (or sensor) in which the sign of potential difference $DV_i$ is inverted, the position of magnet 5 can be determined.

Sensor $S_r$ in which sign inversion of the potential difference occurs may be detected in different ways, one of which is shown, for example in FIG. 1. Each sensor $S_i$ is connected by contacts $C_{i-1}$, $C_i$ to a respective comparator 10, the output 11 of which generates a binary signal with respect to ground. The logical value of the output depends on the sign of the potential difference between the contacts to which comparator 10 is connected. Outputs 11 are connected to respective inputs of an encoding circuit 12 which has circuitry for generating, at output 13, a numerical signal proportional to the position of sensor $S_r$.

FIG. 1 also shows, schematically, the current sources 15, one for each sensor $S_i$, for generating currents I. Elementary sensors $S_i$, current sources 15, comparators 10, and encoding circuit 12 are preferably integrated in a single chip 2, more specifically, in an epitaxial layer, e.g. of N-type, grown on a P-type substrate, (as explained later with reference to FIGS. 6 and 7).

In the FIG. 1 device, if l is the length of chip 2 (in direction X in which sensors $S_i$ and contacts $C_i$ are aligned) corresponding to the maximum position detection range; and w is the distance between elementary sensors $S_i$, corresponding substantially to the width of each sensor in the same direction; then l=nw, so that the position of magnet 5 is determined discretely in n steps with an absolute resolving power of w and a relative resolving power of 1/n. If, for example, l=4 mm and w=200 μm; n=20, with an absolute resolving power of 200 μm and a relative resolving power of 5%.

In other words, the present sensor supplies ready-quantized position information because field B being sampled in a finite number of points by a finite number of sensors. Therefore, the present sensor is insensitive to the absolute magnetic field strength (absolute magnetic induction value), and consequently to the distance of the magnetic element along the Z axis, providing the field exceeds a minimum value enabling the signal (potential difference) to be distinguished from offset and noise. As such, any nonlinearity of the field strength-distance relationship no longer requires complex logic to process the signal generated by the sensors.

Furthermore, the sensor is insensitive to misalignment of the magnet along the X axis, i.e., lack of parallelism between the magnet and elementary sensor array. Such misalignment generally results in a reduction in the strength of magnetic induction B, but has no affect on the X coordinate at which component $B_Z$ is zeroed. Thus the sensor only measures the variation in position along the X axis.

The sensor is also insensitive to variations in quantities affecting the transfer constant of Hall-effect sensors, such as supply voltage and current, mobility of the carriers in the semiconductor material, and temperature (which affects the above parameters) and is insensitive to any nonlinearity, typical of Hall-effect sensors, between position and the detected potential difference.

Therefore, the need is eliminated for mechanical alignment and electrical calibration, thus greatly simplifying and reducing the cost of installation, manufacture and operation (e.g. by means of appropriate processing routines) for compensating for factors which impair or at least reduce the reliability of known analog sensors. Moreover, the present sensor is extremely stable with respect to variations in temperature, supply voltage, and age.

Being ready-quantized, the output of the present sensor can be is immediately processed by using binary circuitry, with no conversion required, thus providing advantages in terms of circuitry and processing time.

Figure 3:
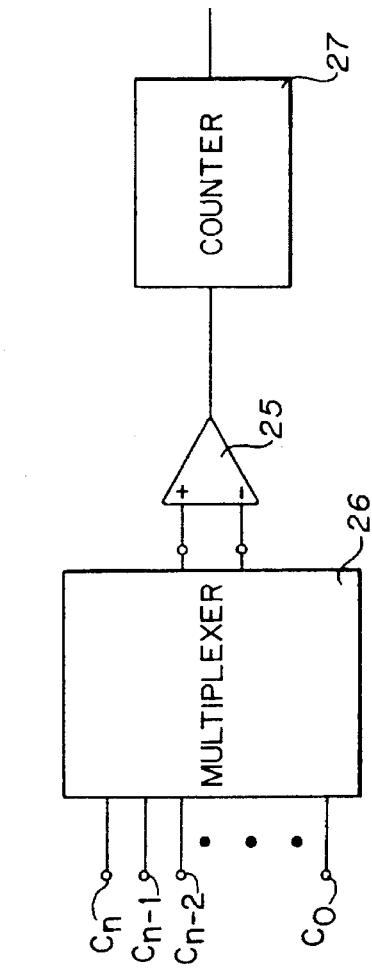
FIG. 3 is a block diagram of another embodiment of a portion of the transducer of FIG. 1.

The circuitry for detecting and processing the voltage signal generated by the elementary sensors may vary considerably. For example, referring to FIG. 3, a single comparator 25 may be employed, the two inputs of which are time-share-multiplexed to pairs of contacts $C_{i-1}$, $C_i$ of elementary sensors $S_i$ via a multiplexer 26. A counter 27 for counting, for example, the number of high states at the output of comparator 25 has, for each complete scan of the sensor array, a count proportional to the position of the magnet. In this embodiment, comparator 25, multiplexer 26, and counter 27 may be integrated on the same chip as sensor 1.

The elementary sensors may or may not be mutually isolated, since the currents in the sensors have no components along the X axis. Moreover, adjacent contacts of adjacent elementary sensors need not necessarily be short-circuited, especially if the elementary sensors are mutually isolated as mentioned above. In this case, each comparator may be connected solely to a respective pair of contacts; or each elementary sensor may have a first contact connected to the input of a first multiplexer, and another contact connected to the input of a second multiplexer, with the outputs of the two multiplexers connected to the two inputs of a comparator, similar to comparator 25 in FIG. 3. In this case, the increase in the number of connections is offset by greater freedom to optimize the sensors.

Figure 6:
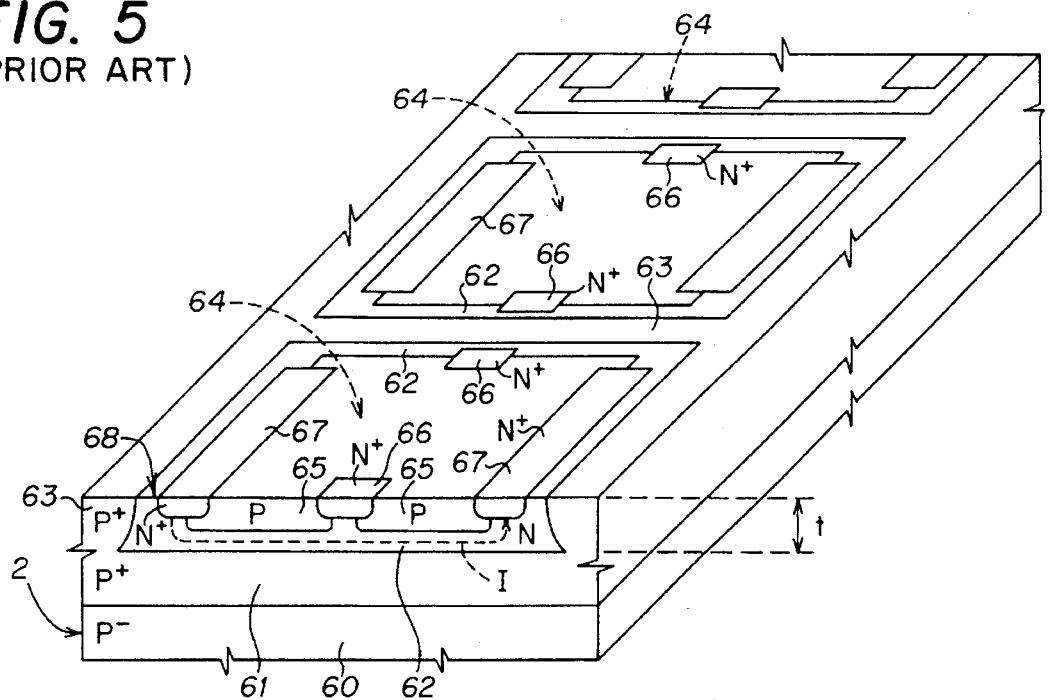
FIGS. 6 and 7 are broken perspective views of other embodiments of an implementation according to the present invention.
Figure 7:
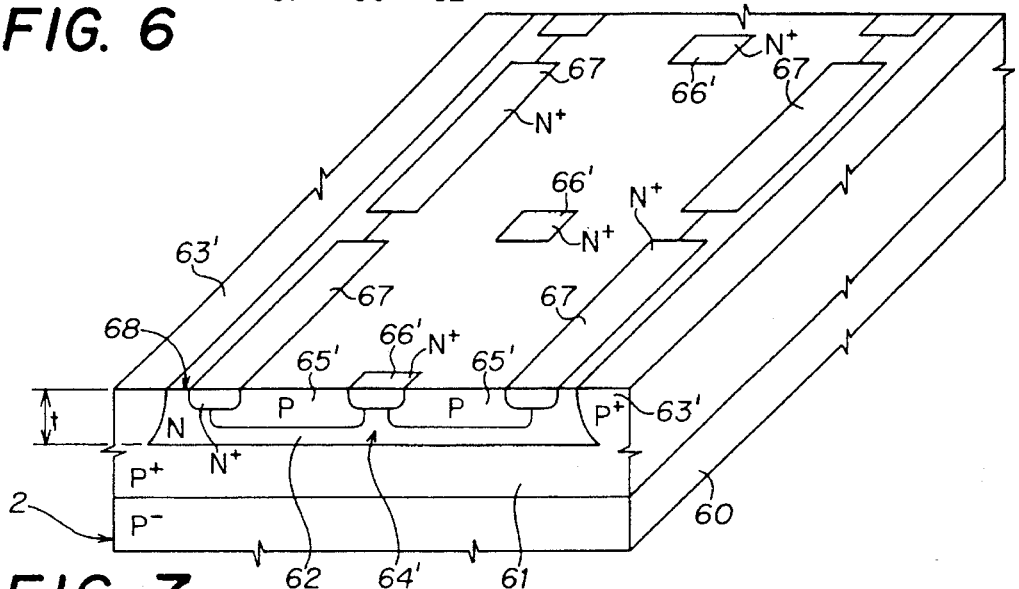

Two possible implementations of sensors with isolated and non-isolated elementary sensors are shown in FIGS. 6 and 7. The sensor of FIG. 6 has a $P^-$-type substrate 60; a $P^+$-type bottom isolation region 61, covering the entire top surface of the substrate 60; an N-type epitaxial layer 62; a $P^+$-type top isolation region 63 formed in the epitaxial layer and laterally delimiting therein a plurality of active regions 64, each forming an elementary Hall sensor; P-type base diffusion regions 65 formed in the epitaxial layer and upwardly delimiting the active regions 64; first $N^+$-type contact regions 66 forming contacts $C_i$, $C_{i+1}$ of an elementary sensor $S_i$ (two contact regions 66 for each elementary sensor); and second $N^+$-type contact regions 67, two for each elementary sensor, forming contacts for injection of current I. Both first and second contact regions 66, 67 are formed at the edge of base diffusion regions 65 and are directly connected to epitaxial layer 62. Therefore, in the sensor of FIG. 6, each elementary sensor $S_i$ is isolated from the adjacent elementary sensors or cells by the isolation region 63, and has its own contact regions 66.

Referring to FIG. 7, the elementary sensors are not isolated from one another, and the contacts $C_i$ are shared with the adjacent sensors. The sensor of FIG. 7 thus comprises substrate 60; bottom isolation region 61; epitaxial layer 62; a top isolation region 63', laterally delimiting a single active region forming all (or a group of) elementary sensors $S_i$; a single base diffusion region 65'; first contact regions 66' forming contacts $C_i$, each first contact region 66' of an elementary sensor being shared with the adjacent elementary sensor; and a pair of second contact regions 67 for each elementary sensor $S_i$.

Figure 5:
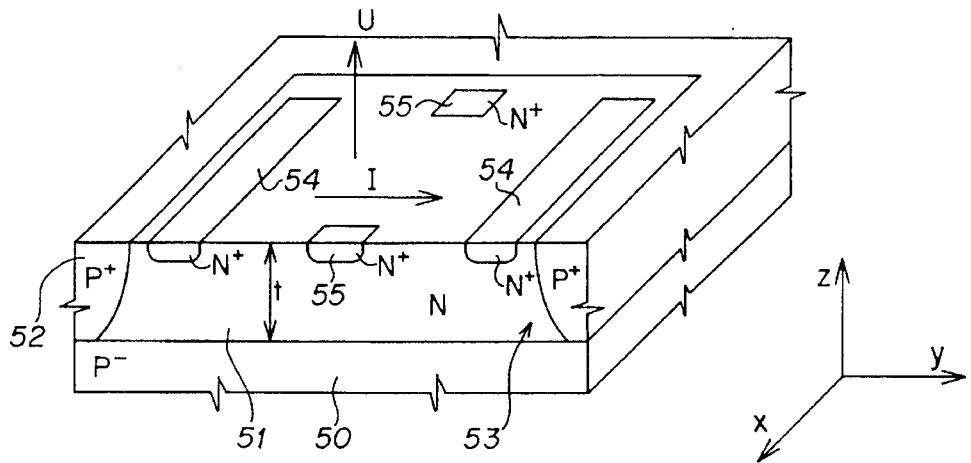
FIG. 5 is a perspective view of a known integrated Hall cell.

In both implementations, the depth of the epitaxial layer 62 is about half the depth of the epitaxial layer 51 of a typical implementation as shown in FIG. 5. The depth is reduced by the bottom isolation region 61 formed by diffusion of P-type dopants into the epitaxial layer from below. Therefore Hall effect voltage $V_H$, defined by equation (1), is doubled, increasing sensor sensitivity. Furthermore, the base diffusion regions 65, 65' serve a double function: they eliminate surface effects which affect offset voltage VOS; and further they increase Hall effect voltage $V_H$. Indeed, the active areas of elementary sensors $S_i$ are completely isolated, by base diffusion regions 65, 65' from the Si-SiO$_2$ interface region formed at the upper main surface 68 of the sensor structure of FIGS. 6 and 7 (which is covered by an oxide layer which not shown. Moreover, the base diffusion regions 65, 65' reduce the depth of epitaxial layer 62, further increasing the value of Hall effect voltage $V_H$. Therefore, with the implementation of FIGS. 6 and 7, the Hall effect voltage $V_H$ is significantly increased.

Both embodiments may be easily implemented using known manufacture processes, including the known top-bottom isolation technique. With this technique junction isolation between active areas is obtained in two different implantation steps, one performed before growing the epitaxial layer, for forming, later, the bottom portion of the isolation regions, and the other performed onto the grown epitaxial layer, for forming the top portion of the isolation regions, merging with the bottom portion. Furthermore, manufacture of the present sensor does not require additional masks. In particular, a possible schematic manufacture step sequence is the following: $P^-$-type substrate 60 is implanted with high-energy P-type doping species, to later form bottom isolation region 61, such implantation being performed both at the areas where lateral isolation regions and the active region(s) of the sensor are to be formed. Thereafter epitaxial layer 62 is grown, P-type doping species are implanted to form top isolation region 63, 63', and base diffusion regions 65, 65' are formed in the same step as base regions of any transistor integrated in the same chip as the sensor (for example to form components 10, 12 of FIG. 1). Note that base diffusion regions 65, 65' are obtained using a mask which covers the epitaxial layer at the zones where first contact regions 66, 66' are to be formed; thereby such zones are not diffused with P-type dopants and later allow contiguity between first contact regions 66, 66' and active regions 64, 64', as important in particular for the embodiment of FIG. 7. Thereafter, N-type doping species are implanted or diffused to form contacts 66, 66', 67 and usual finishing manufacture steps are performed.

In general, the elementary sensors may be aligned along any flat line lying in plane 7 of chip 2 and parallel to the path of magnet 5, e.g. a line in the form of an arc.

Figure 4:
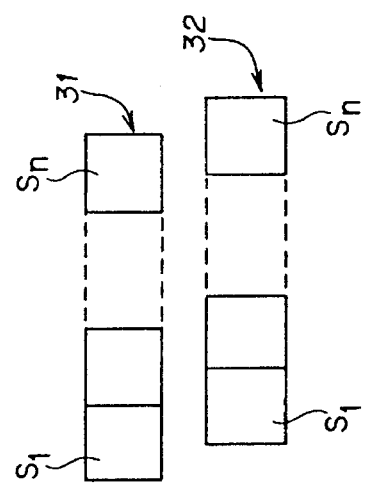
FIG. 4 is a different embodiment of the cross-section of the sensor of FIG. 1 taken along line II—II.

Also, the sensor may have more than one plurality of elementary sensors, as shown by way of example in FIG. 4. Two pluralities 31 and 32 of elementary sensors $S_1$-$S_n$ can be arranged in two-parallel lines offset by w/2, w being the distance between the adjacent elementary sensors in each plurality. Both pluralities may be integrated in the same chip 2. Such an embodiment enhances resolving power, and, despite increasing (doubling) the current and the space required for integrating the sensor, the maximum dimension in which the elementary sensors in each plurality are aligned remains unchanged. Such a solution may obviously be extended to N pluralities of sensors offset by w/N to give a resolving power of w/N and N times the current. The number of pluralities of elementary sensors is limited theoretically by the possibility of safely detecting the difference in the sign of the magnetic field component detected between two elementary sensors belonging to two different pluralities and offset by w/N.

The magnetic element may be formed in any manner, providing it has at least one magnetic field component zeroing in at least one point (preferably on a surface), and, more specifically, may consist of a permanent bar magnet, as described, or an appropriate magnetic circuit. Moreover, the useful field component ($B_z$) and consequently the extent to which it varies about zero may be increased by providing a plate of highly permeable magnetic material in a plane parallel to plane X, Y defined by chip surface 7, and in the opposite half space to that occupied by magnet 5 (in the example shown, underneath chip 2). Alternatively, the same may be achieved using a second magnet, also located in the opposite half space to that of the first magnet, and having its south pole aligned with the north pole of the first magnet and vice versa, in which case, both magnets must move integral with each other in relation to the sensor.

Having described various embodiments of the present invention, other modifications may be made without departing from the scope of the appended claims.

What is claimed is:

1. An apparatus for detecting the position of a magnetic element, wherein the apparatus generates a magnetic field having a magnetic induction component equal to zero at a location in space, the apparatus comprising:

a first plurality of solid-state Hall-effect sensors integrated adjacent one another on a single chip, each sensor causing an output voltage to be generated based on a detected component of a magnetic field;

a second plurality of Hall-effect adjacent sensors, each of the sensors of the second plurality of sensors causing an output voltage to be generated based on a detected component of a magnetic field, wherein the first and second pluralities of sensors are each arranged in approximately a line, wherein the line of the first plurality of sensors is substantially parallel to the line of the second plurality of sensors, and wherein the sensors of the first plurality of sensors are offset from the sensors of the second plurality of sensors; and zero detecting means, connected to the sensors, for receiving the output voltage from the first plurality of Hall-effect sensors and the second plurality of Hall-effect sensors and for generating an output signal indicating a location where the magnetic induction component of the magnetic field is zero.

2. The apparatus of claim 1 wherein the output signal generated by the zero detecting means indicates a position of a first sensor generating an electric output signal which is opposite in sign to an electric output signal generated by a second sensor adjacent the first sensor.

3. The apparatus of claim 2 wherein the zero detecting means includes a number of comparators, each of which has an input terminal connected to a sensor and each of which has an output terminal for providing a signal indicating the sign of the magnetic field component for each sensor.

4. The apparatus of claim 3 further comprising an encoder circuit connected to the outputs of the comparators for generating a quantized position signal indicating the position of the magnetic element relative to one of the sensors.

5. The apparatus of claim 1 wherein the zero detecting means comprises:

a multiplexing element having a number of inputs terminals connected to the sensors and an output terminal;

a comparator having an input terminal connected to the output terminal of the multiplexing element and an output terminal; and a counter, connected to the output terminal of the comparator, for counting a number of high states at the output terminal of the comparator, wherein the count is related to the position of the magnetic element.

6. The apparatus of claim 1 wherein the sensors are aligned in a straight line and each sensor has a pair of contacts.

7. The apparatus of claim 6 wherein, for each sensor, a contact of one sensor is connected to a contact of an adjacent sensor.

8. The apparatus of claim 1 wherein each sensor is integrated in a semiconductor body comprising:

a substrate of a first conductivity type;

a bottom isolation region of the first conductivity type overlying the substrate;

an epitaxial layer of a second conductivity type, overlying the bottom isolation region and defining an upper face of the semiconductor body;

a top isolation region of the first conductivity type, the isolation region being formed in the epitaxial layer and laterally delimiting an active region in the epitaxial layer;

an interface isolation region of the first conductivity type grown into the epitaxial layer and isolating the active region; and contact regions of the second conductivity type in direct contact with the active region of the epitaxial layer.

9. The apparatus of claim 8 wherein each sensor comprises an active region and wherein the active regions of adjacent sensors are isolated from each other by a portion of the top isolation region.

10. The apparatus of claim 8 wherein there is only a single active region forming the sensors.

11. The apparatus of claim 8 wherein at least some of the contact regions are arranged at windows of the interface isolation region and extend toward the epitaxial layer to directly contact the epitaxial layer.

12. The apparatus of claim 8, wherein the bottom isolation region is contiguous with the substrate.

13. The apparatus of claim 8, wherein the thickness of the epitaxial layer is about half of the combined thickness of the epitaxial layer and the bottom isolation region.

14. An apparatus for detecting the position of a magnetic element which generates a magnetic field, the apparatus comprising:

a first plurality of adjacent Hall-effect sensors for detecting a zero point of a component of the magnetic field;

wherein the sensors are solid-state sensors integrated adjacent to one another in a single chip of semiconductor material and wherein each sensor is integrated in a semiconductor body comprising:

a substrate of a first conductivity type;

a bottom isolation region of the first conductivity type overlying the substrate;

an epitaxial layer of a second conductivity type, overlying the bottom isolation region, the epitaxial layer defining an upper face of the semiconductor body;

a top isolation region of the first conductivity type, the top isolation region being formed in the epitaxial layer and laterally delimiting an active region in the epitaxial layer;

an interface isolation region of the first conductivity type grown into the epitaxial layer and isolating the active region in the epitaxial layer from the upper face; and contact regions of the second conductivity type in direct contact with the active region of the epitaxial layer.

15. The apparatus of claim 14, further comprising:

position detecting means coupled to the first plurality of sensors for providing a signal indicating a position of a first sensor which generates an output signal opposite in sign to an output signal generated by a sensor adjacent the first sensor.

16. The apparatus of claim 15 further comprising:

a number of comparators, each of which is connected to a sensor and each of which has an output terminal for providing a signal indicating the sign of the magnetic field component; and an encoder circuit connected to the output terminals of the comparators for generating a signal indicating a position of the magnetic element relative to the sensors.

17. The apparatus of claim 14 further comprising:

a multiplexing element having a number of inputs terminals connected to the sensors and an output terminal;

a comparator having an input terminal connected to the output terminal of the multiplexing element; and a counter, connected to the output terminal of the comparator, for counting a number of high states at the output terminal of the comparator, wherein the count is related to the position of the magnetic element.

18. The apparatus of claim 14, wherein the thickness of the epitaxial layer is about half of the combined thickness of the epitaxial layer and the bottom isolation region.

19. The apparatus of claim 14, further comprising a second plurality of adjacent Hall-effect sensors for detecting a zero point of a component of the magnetic field, wherein the first plurality of sensors and the second plurality of sensors are each arranged in generally parallel straight lines, and wherein the sensors of the second plurality of sensors are offset from the sensors of the first plurality of sensors.

20. The apparatus of claim 19, wherein the second plurality of sensors are solid-state sensors integrated adjacent to one another in a single chip of semiconductor material.

21. The apparatus of claim 14; wherein at least two sensors of the first plurality of sensors are formed in a single active region of the semiconductor.

* * * * *